United States Patent [19]
Zorian

[11] Patent Number: 5,381,419
[45] Date of Patent: Jan. 10, 1995

[54] METHOD AND APPARATUS FOR DETECTING RETENTION FAULTS IN MEMORIES

[75] Inventor: Yervant Zorian, Princeton, N.J.

[73] Assignee: AT&T Corp., Murray Hill, N.J.

[21] Appl. No.: 24,695

[22] Filed: Mar. 1, 1993

[51] Int. Cl.$^6$ ............................................. G11C 29/00
[52] U.S. Cl. .................................... 371/21.3; 371/21.1
[58] Field of Search ................... 371/21.3, 21.1, 22.5, 371/27, 11.1, 21.6, 26, 16.5, 16.4, 29.1, 21.2, 15.1; 365/201

[56] References Cited

U.S. PATENT DOCUMENTS

| | | | |
|---|---|---|---|
| 3,751,649 | 8/1973 | Hart | 371/21.3 |
| 4,965,799 | 10/1990 | Green et al. | 371/21.4 |
| 4,969,148 | 11/1990 | Nadeau-Doslie et al. | 371/21.1 |
| 5,033,048 | 7/1991 | Pierce et al. | 371/21.2 |
| 5,053,698 | 10/1991 | Ueda | 371/21.4 |
| 5,222,066 | 6/1993 | Grula et al. | 371/21.1 |
| 5,224,101 | 6/1993 | Popyack, Jr. | 371/21.1 |
| 5,229,999 | 7/1993 | Cushing et al. | 371/22.3 |
| 5,258,986 | 11/1993 | Zerbe | 371/21.2 |
| 5,274,648 | 12/1993 | Eikill et al. | 371/21.2 |

OTHER PUBLICATIONS

R. Dekker, F. Beenker, and L. Thijssen, "A Realistic Fault Model and Test Algorithms for Static Random Access Memories", *IEEE Transactions on Computer-Aided Design*, vol. 9, No. 6, Jun. 1990, pp. 567–572.

*Primary Examiner*—Charles E. Atkinson
*Assistant Examiner*—Dieu-Minh Le
*Attorney, Agent, or Firm*—Robert B. Levy

[57] ABSTRACT

The present invention is directed to a method for detecting retention faults in each of a plurality of read/write memory elements ($12_1$-$12_z$), arranged in a plurality of banks ($14_1$-$14_k$) coupled in daisy chain fashion. Retention faults are detected, in accordance with the method, by signaling the banks in sequence, at each of three separate intervals, to cause the memory elements in each bank to execute a first, second and third sequence of read and/or write instructions. Execution of the second sequence of read and/or write operations is delayed so each memory element can be read after a prescribed interval to detect a first bit pattern written in each memory at the end of the first sequence. Similarly, execution of the third sequence of read and/or write operations is delayed so each memory element can be read after a prescribed interval to detect a second bit, complementary to the first pattern, written in the memory element at the end of the second sequence. By delaying the execution of the second and third sequences of read and/or write operations, retention faults, if any, can manifest themselves.

11 Claims, 1 Drawing Sheet

METHOD AND APPARATUS FOR DETECTING RETENTION FAULTS IN MEMORIES

TECHNICAL FIELD

This invention relates to a technique for detecting retention faults in memory elements in an integrated circuit.

BACKGROUND OF THE INVENTION

Many integrated circuits are now fabricated with at least one read/write memory element that is capable of reading and writing data, such as a Random Access Memory (RAM), a Content Addressable Memory (CAM), a First-In, First-Out (FIFO) register or a Register File (RF), for example. Each read/write memory element in an integrated circuit is commonly tested to detect different types of faults by causing the memory element to execute a sequence of read and write operations unique to the particular type of memory to be tested. Among the faults sought to be detected during testing of a read/write memory element are retention faults. A retention fault occurs when a memory cell in the read/write memory element is unable to hold a value, such as a binary "1" or "0," over time.

The most common technique presently used to detect retention faults is to initiate execution by the memory element of its particular sequence of read and write operations. The sequence of operations is typically interrupted at each of two points for a predetermined interval (e.g., 100 milliseconds) to enable the retention faults, if any, to manifest themselves. The exact point at which the sequence of read and write operations should be interrupted depends on the nature of the memory element being tested.

The above-described retention fault testing scheme is not autonomous because the sequence of read and write operations must be manually interrupted to allow retention faults to manifest themselves. As indicated, the exact point at which the interruption should occur is dependent on the nature of the memory element being tested. Thus, the intervention of a test engineer during testing is generally required.

The above-described retention fault testing scheme is not unified because the sequence of read and write operations executed by each memory must be interrupted twice before another successive memory can execute its particular sequence of read and write operations. Accordingly, retention fault testing is thus delayed by the interruption interval allocated to each memory to allow for its retention faults (if any) to manifest themselves. Since the interruption (delay) interval is cumulative, the testing of a large number of memories in a single integrated circuit in succession thus becomes a lengthy process, leading to a long test time for the circuit.

Thus, there is a need for a retention fault detection technique which is both autonomous and unified.

SUMMARY OF THE INVENTION

Briefly, in accordance with a preferred embodiment of the invention, there is disclosed a method for detecting retention faults in a plurality of memory elements arranged in banks. Each memory has the capability of testing itself by executing each of three sequences of read and/or write operations in succession. The method of the invention is initiated by first signaling the banks of memory elements in succession to cause the memory elements in each successive bank to each execute their first sequence of read/write operations. The first sequence of read and write operations in each memory element has a write operation as its last activity so that upon completion of the first sequence, a first pattern of bits, unique to the type of memory element being tested, is written in that memory element.

After a first predetermined interval, the banks of memory elements are signaled in succession for a second time to cause each memory element in each successive bank to execute its second sequence of read and write operations. The second sequence of read and write operations stored in each memory element in each bank begins with a read operation that is executed to detect the presence of the first pattern of bits in the memory, which pattern was presumably written during the first sequence of operations. The second sequence of operations also has as its last write operation, an operation during which a second pattern of bits is written in the memory element complementary to the first pattern.

After a second predetermined interval, the banks of memory elements are signaled for a third time to cause each memory element in each successive bank to execute its third set of read and write operations. The third set of read and write operations includes a read instruction that is executed to detect the presence of the second pattern of bits in the memory element.

The above-described technique offers the advantage of autonomy since there is no need to interrupt any of the three individual sequences of read and write operations during their execution. Rather, a delay is automatically imposed after all of the memory elements in the banks have executed their first sequence of operations, and another delay is imposed after all the memory elements in the banks have executed their second sequence of operations to allow the retention faults (if any) to manifest themselves. Thus, the delay intervals are fixed regardless of the number of banks of memories being tested, rather than being cumulative as with past retention fault testing. Moreover, the above-described technique affords a unified approach to retention fault testing since each read/write memory element executes each storm sequence of read and write operations without interruption.

DETAILED DESCRIPTION

Figure 1:
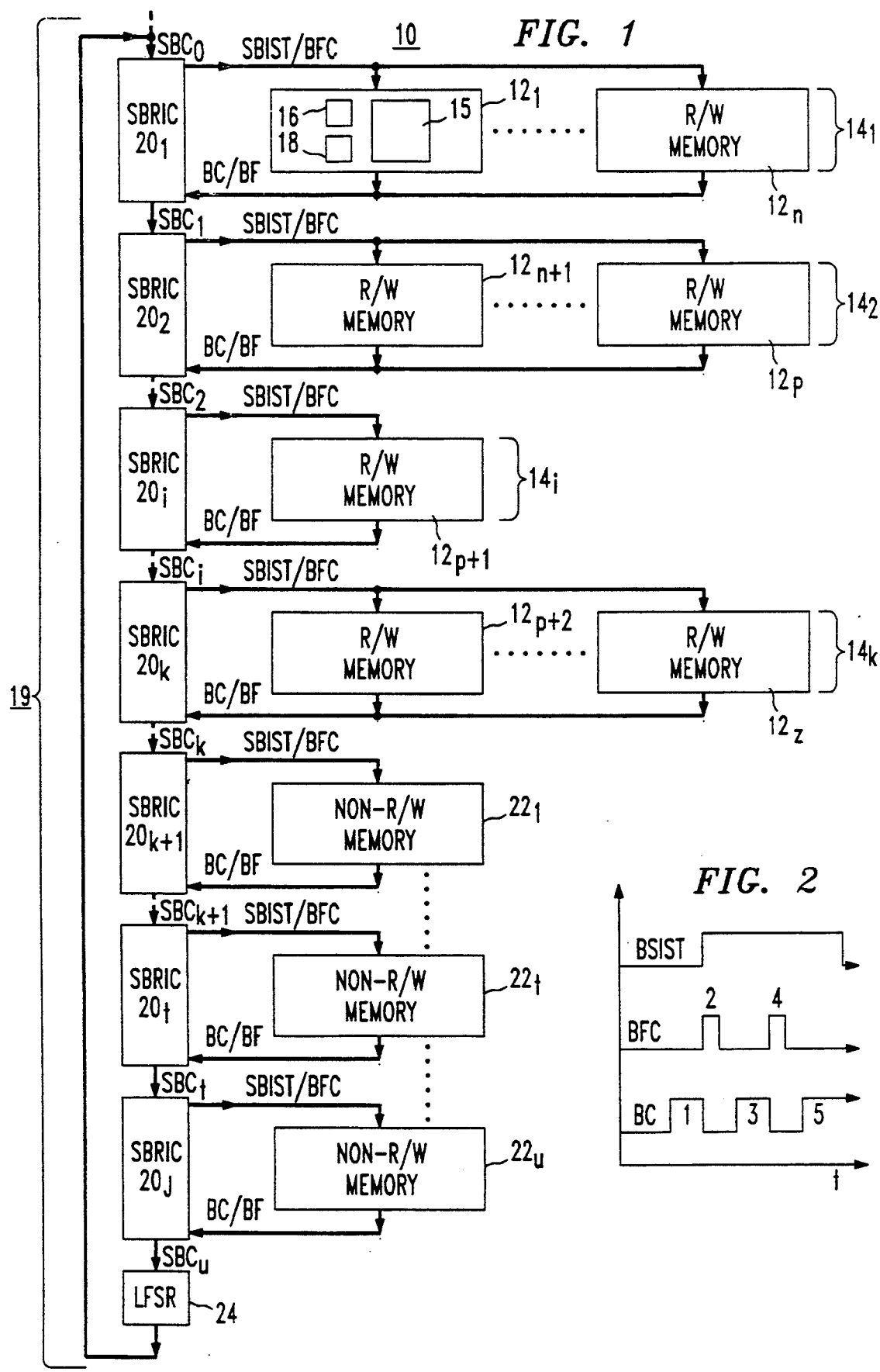
FIG. 1 is a block schematic diagram of an apparatus for detecting retention faults in each of a plurality of banks of memory elements in an integrated circuit.

FIG. 1 depicts an integrated circuit 10 containing a plurality of read/write memory elements $12_1 \ldots 12_n$, $12_{n+1} \ldots 12_p$, $12_{p+1}, 12_{p+2} \ldots 12_z$ where n, p and z are all integers such that $z>p>n$. In practice, the memory elements $12_1$-$12_z$, which are each capable of both reading and writing data, are arranged in banks $14_1, 14_2 \ldots 14_k$, where k is an integer $<z$, such that each bank contains at least one memory element. Each of the memory elements $12_1 \ldots 12_z$ may take the form of a Random Access Memory (RAM), a Content Addressable Memory (CAM) a First-In, First-Out (HFO) Register, or a Register File (RF), as are all well known in the art.

The memory elements $12_1$-$12_z$ each contain a main memory 15 and a built-in self-test circuit 16 unique to the structure of the main memory. For example, when the main memory 15 of the element $12_p$ is configured of a RAM, then the built-in self-test circuit 16 may be configured in the manner described in U.S. Pat. No. 4,872,168, "Integrated Circuit with Memory Self-Test," issued on Oct. 3, 1989, in the names of D. R. Aadsen et al., and assigned to the instant assignee, herein incorporated by reference. Built-in, self-test circuitry for other types of read/write memory elements, such as CAMs, FIFO registers and RFs, also exists and is well known in the art.

Associated with the built-in, self-test circuitry 16 in each of the memory elements $12_1$-$12_z$ is a finite state machine 18 or a similar device which causes the test circuit 16 to execute each of three separate sequences of read and write operations on the memory 15 in sequence. Each sequence of operations (described in detail below), when executed, causes the test circuit 16 to write data into, and read previously written data from, the main memory 15 to determine if the previously written dam was written properly. The reading and writing of data in the main memory 15 of each of the memory elements $12_1$-$12_z$ serves to test that memory element for faults, including retention faults.

A control apparatus 19, in accordance with the invention, controls the testing of the mad/write memory elements $12_1$-$12_z$ in the banks $14_1$-$14_k$. The apparatus 19 includes a plurality of controllers $20_1, 20_2 \ldots 20_k$, each associated with a corresponding one of the memory banks $14_1, 14_2 \ldots 14_k$. In practice, each of the controllers $20_1$-$20_k$ advantageously comprises a Standard, Built-In, Self-Test Resource Controller (SBRIC) which is described in U.S. patent application Ser. No. 876,169, "Built-In Self-Test Network," filed on Apr. 30, 1992, in the names of C. W. Yau and Y. Zorian, and assigned to the instant assignee (herein incorporated by reference). While the control apparatus 19 is illustrated in the preferred embodiment as a set of separate individual control elements (i.e., the SBRICs $20_1$-$2_k$), it should be understood that the control apparatus could be comprised of a single, unitary structure.

Each SBRIC, as exemplified by SBRIC $20_i$ (where i is an integer $<k$), initiates testing of the memory element(s) in its corresponding memory bank $14_i$ by supplying a Start Built-In Self-Test (SBIST) signal to the memory elements in that bank following receipt by the SBRIC of an SBRIC Begin Command (SBC$_{i-1}$) signal. When each memory element of the bank $14_i$ has completed self-testing, the memory element generates a BIST Complete (BC) signal that is supplied to the SBRIC $20_i$ to indicate that the memory elements have completed self-testing.

After supplying the BC signal, each of the memory elements in the corresponding memory bank $14_i$ associated with the SBRIC $20_i$ supplies that SBRIC with a signal (BF) indicative of the state of an internal flag (not shown), referred to as the BIST flag, which is set in accordance with the result of the self-testing the memory element has just performed. To avoid an erroneous result when the flag itself is faulty, the three sequences of read and write operations executed in sequence by each of the memory elements $12_1$-$12_z$ are designed such that the BIST flag toggles (i.e., changes state) after the first and/or second sequence of read and write operations if no faults are present. Thus a failure of the BIST flag to change states after the first or second sequence of read and write operations indicates that the BIST flag is faulty.

Once the SBRIC $20_i$ has received the BC and BF signals from the memory elements in the bank $14_i$, the SBRIC 20 generates a test complete signal designated as SBC$_i$. As may be appreciated, the SBRIC Begin Command and test complete commands for the SBRIC $20_i$ bear the same general legend SBC but are differentiated by the subscript notations $i-1$ and $i$, respectively. The SBRICs $20_1$-$20_k$ are daisy-chained together such that the test complete signal of each preceding SBRIC $20_{i-1}$ in the chain serves as the SBRIC Begin Command for the next successive SBRIC $20_i$. In this way, the testing of the memory element banks $14_1$-$14_k$ is sequenced by the SBRICs $20_1$-$20_k$, respectively, with the memory elements in each successive bank being tested simultaneously.

The initial receipt of the SBIST signal by each of the memory elements in an associated bank $14_i$ from the associated SBRIC $20_i$ is sufficient to cause that memory element to commence execution of its first sequence of read and write operations. In order to signal each memory element in an associated bank $14_i$ to execute its second, and later, its third sequence of read and write operations, the SBRIC $20_i$, following receipt of an SBC$_{i-1}$ signal, also supplies the memory element in the bank with a logic high level BIST Function Control (BFC) signal. As will be discussed in greater detail below, the BFC signal generated by the SBRIC $20_i$ only transitions to a logic high level once the BC and BF signals from the memory elements in the associated bank $14_i$ have initially gone to a logic high level after execution of the first sequence of read and write operations.

Depending on its configuration, the integrated circuit 10 may also include one or more non-read/write elements $22_1$-$22_u$ (where u is an integer $>1$) each such element typically taking the form of a Read Only Memory (ROM), a Programmable Logic Array (PLA), or a Random Logic Element (RLE), for example, which is "BIST'd (i.e., the element contains built-in self-test circuitry (not shown)). The circuit 10 may also include non-BIST'd blocks (not shown).

Associated with each of the non-read/write memory elements $22_1$-$22_u$, is a separate one of a plurality of SBRICs $20_{k+1}$-$20_u$, each controlling the self-testing of an associated non-read/write element. Each of the SBRICs $20_{k+1}$-$20_u$ is of the same type described in the aforementioned co-pending application Ser. No. 07/876169, herein incorporated by reference. Like the SBRICs $20_1$-$20_k$, the SBRICs $20_{k+1}$-$20_u$ are coupled in daisy-chain fashion such that each SBRIC $20_t$ (where $t \geq k+1$) supplies its test complete signal SBC$_t$ to the SBRIC begin command input of the next successive SBRIC $20_{t+1}$ in the chain. As shown in FIG. 1, the chain of SBRICs $20_{k+1}$-$20_u$ is coupled in series with the chain of SBRICs $20_1$-$20_k$ such that the last SBRIC $20_k$ supplies its test complete signal SBC$_k$ to the SBRIC begin test input SBC$_k$ of the SBRIC $20_{k+2}$. Each of the SBRICs $20_{k+1}$-$20_u$ does differ from each of the SBRICs $20_1$-$20_k$ in one regard. The SBRICs $20_1$-$20_u$ each initiate self-testing of a corresponding one of the non-read/write memory elements $20_1$-$20_u$ only once, whereas each of the SBRICs $20_1$-$20_k$, initiates self-testing of the memory elements in a corresponding one of the banks $14_1$-$14_k$ elements three times, so each memory element executes a separate one of its three sets of read and write operations in succession. While the SBRICs $20_1$-$20_k$ and $20_{k+1}$–$20_u$ are described in terms of two separate chains, such need not be the case. Rather the SBRICs $20_l$–$20_k$ and $20_{k+1}$–$20_u$ could be interleave in a single chain.

The test complete signal (SBC$_u$) from the SBRIC $20_u$ element, or in the absence of any non-read/write memory element $22_t$ the test complete signal SBC$_k$ from the SBRIC $20_k$, is supplied to a Linear Feedback Shift Register (LFSR) 24 or other type of counter which comprises part of the control apparatus 19. Upon receipt of the test complete signal, the LFSR 24 counts to a prescribed count before supplying an SBRIC begin command SBC$_0$ signal to the SBRIC $20_1$. By counting to a prescribed count before supplying the SBRIC $20_1$ with an SBRIC begin command, the LFSR 24 effectively delays the receipt by the SBRIC $20_1$ of the test complete signal from the SBRIC $20_u$ or, in its absence, the SBRIC $20_k$.

Testing of the banks $14_l$–$14_k$ of memory elements $12_1$–$12_z$, and particularly, detection of retention faults, is carried out in the following manner. First, an SBRIC begin command signal SBC$_0$ is supplied to the first SBRIC $20_1$ in the chain from an external source (not shown), such as, for example, a well-known TAP controller or the like. In response to the SBC$_0$, the SBRIC $20_1$ supplies each of the read/write memory elements $12_l$–$12_n$ in the first bank $14_l$ with the SBIST signal to cause each memory element to initiate self-testing. Each of the memory elements $12_l$–$12_p$, initiates self-testing by executing its first sequence of read and write operations.

The sequence of read and write operations executed by each of the read/write memory elements $12_l$–$12_n$ depends upon the nature of that element. For instance, if the particular read/write memory element is a RAM, then a read and write operation sequence would be appropriate for a RAM. By way of example, the following instruction set sequence, consisting of five sets (a), (b), (c), (d) and (e) of read and write operations, might be executed when the memory element is a RAM:

(a) $\uparrow$ $W^x$
(b) $\uparrow$ $R_x W^{\bar{x}} W^x W^{\bar{x}}$
(c) $\uparrow$ $R_{\bar{x}} W^x R_x W^{\bar{x}}$
(d) $\downarrow$ $R_{\bar{x}} W^x W^x W^x$
(e) $\downarrow$ $R_x W^{\bar{x}} R_{\bar{x}} W^x$ The first set of operations (a) consists of a single write operation $W^x$, which, when executed, writes a first bit pattern X (e.g., all zeros) into a successive row of cells in the memory element, beginning with the first (i.e., lowest order) row.

The second set of operations (b) begins with a read operation ($R_x$) during which the bits in a successive row of cells are read to detect the presence of the first bit pattern X. After the read operation $R_x$, a write operation $W^{\bar{x}}$ is performed on the same row of cells, during which a second pattern of bits $\bar{X}$, complementary to the first pattern, is written in the row. Following the write operation $W^{\bar{x}}$ another a write operation $W^x$ is performed on the same row, during which the first pattern of bits X is written into the row over the previously written second pattern. The last operation in the set (b) is a write operation $W^{\bar{x}}$ during which the second pattern of bits $\bar{X}$ is written in the row. The operations: $R_x$, $W^{\bar{x}}$, $W^x$, and $W^{\bar{x}}$ are performed in sequence on each successive row of memory cells, beginning with the first row.

Following the operation of set (b), a third set of operations (c) is performed, consisting of the previously described read operation $R_{\bar{x}}$, the write operation $W^x$, the read operation $R_x$, and the write operation $W^{\bar{x}}$. The operations: $R_{\bar{x}}$, $W^x$, $R_x$, and $W^{\bar{x}}$ are performed in sequence on each successive row of memory cells, beginning with the first row.

The third set of operations (c) is followed by a fourth set of operations (d), consisting of the above-described read operation $R_{\bar{x}}$, the write operation $W^x$, the write operation $W^x$, and the write operation $W^x$. The operations: $R_{\bar{x}}$, $W^x W^{\bar{x}} W^x$ are performed in sequence on each successive row of memory cells, starting with the highest row and going downward.

After the fourth sequence of operations (d), a fifth set of operations (e), consisting of the read operation $R_x$, the write operation $W^{\bar{x}}$, the read operation $R_{\bar{x}}$, and the write operation $W^x$, are executed in sequence on each successive row of memory cells, starting with the highest row and proceeding downward.

Depending on the nature of the read/write memory element being tested, a different sequence of read and write operations from that described above may be executed. However, regardless of the sequence of read and write operations, the last write operation in the last set is always the operation $W^x$ during which the first pattern of bits is written into the memory element.

The first sequence of read and write operations is executed by each memory element in the first bank $14_l$ simultaneously with the sequence of read and write operations executed by other memory elements in that bank. Upon the execution of the last operation in the sequence, each memory element in the first bank $14_l$ supplies the SBRIC $20_l$ with a BIST Complete signal (BC). Once the SBRIC $20_l$ receives the BC and BF signals from the memory elements $12_l$–$12_n$ in the bank $14_l$, the SBRIC 20 supplies a logic "high" level test complete signal SBC$_1$ to the input of the next SBRIC (i.e., SBRIC $20_2$) in the chain.

In response to the test complete signal from the SBRIC $20_1$, the SBRIC $20_2$ supplies its SBIST signal to the read/write memory elements $12_{n+1}$–$12_p$ in the bank $14_2$. In response, the read/write memory elements $12_{l+1}$–$12_p$, each execute their first stored sequence of read and write operations in the same general manner as discussed above for the memory elements $12_1$–$12_n$, in the bank $14_1$. As each of the memory elements $12_{n+1}$–$12_p$, completes self-testing, the element supplies its BC and BF signals to the SBRIC $20_2$.

Following receipt of the BC and BF signals from the memory elements $12_{n+1}$–$12_p$ in the bank $14_2$, the SBRIC $20_2$ supplies a logic "high" level test complete signal SBC$_{i-1}$ to the next successive SBRIC $20_i$ which, in turn, initiates self-testing of the memory elements in the associated bank $14_i$ so that each executes its first stored sequence of read and write instructions in the manner described above. Once the memory elements in the bank $14_i$ have been tested as described, then the SBRIC $20_i$ supplies its test complete signal to the next successive SBRIC and the above-described process is repeated. The process continues until each of the memory elements $12_{p+2}$–$12_z$ in the last bank $14_k$, executes its first stored sequence of read and write operations under the command of the SBRIC $20_k$.

Once the last SBRIC $20_k$ receives the BC and BF signals from each of the memory elements $12_{p+2}$–$12_z$ in the bank $14_k$, the SBRIC generates a logic "high" level test complete signal SBC$_k$. The SBC$_k$ signal from the SBRIC $20_k$ is supplied to the first of the SBRICs $20_{k+1}$–$20_u$ when the non-read/write elements $22_t$–$22_u$ are present. Otherwise, the SBC$_k$ signal from the SBRIC $20_k$ is supplied to the LFSR 24. In response to a logic "high" SBC$_k$ signal from the SBRIC $20_k$, the SBRIC $20_{k+1}$ causes its associated non-read/write memory element $22_1$ to commence self-testing. Once the non-read/write element 20 k has commenced self-testing, the element sends a BC signal and then a BF signal to the SBRIC $20_{k+1}$ which then supplies a logic "high" level $SBC_{k+1}$ signal to the SBRIC $20_{k+2}$, which in turn initiates self-testing of its associated non-read/write memory. At the completion of self-testing, the non-read/write element sends its BC and then its BF signal to its associated SBRIC $20_{k+2}$ which, in turn, signals the next successive SBRIC $20_{k+3}$ to initiate Self-testing of its associated non-read/write element. This sequence of operations continues until the SBRIC $20_u$, completes the self-testing of the non-read/write element $22_u$, whereupon that SBRIC supplies its test complete signal $SBC_u$ to the LFSR 24.

In response to the test complete signal $SBC_{k+1}$ from the SBRIC $20_u$, or in response to the test complete signal from the SBRIC $20_k$, the LFSR 24 commences counting. Once the LFSR 24 has counted to a prescribed count (corresponding to a predetermined delay interval, typically 100 milliseconds), the LFSR then generates a logic "high" $SBC_0$ signal to the SBRIC $20_1$, which, in response, signals the memory elements $12_1$-$12_n$ in the bank $14_1$ to execute its second sequence of read and write operations by supplying the memory elements with the BFC signal.

The second sequence of read and write operations executed by the memory elements $12_1$-$12_n$ is the same regardless of the type of memory. (The same is true for the memory elements $12_{n+1}$-$12_z$ in the banks $14_2$-$14_k$.) In the preferred embodiment, the second sequence of read operations consists of the read operation $R_x$ and the write operation $W^{\bar{x}}$ which are performed consecutively on each successive row of memory cells in each memory element, commencing with the lowest order row. During execution of these two operations, the bits in each successive row are first read to detect the presence of the bit pattern X, written during the last write operation of the first sequence of read and write operations. The absence of any value written during the last write operation $W^{\bar{x}}$ of the first sequence of operations is indicative of a retention fault. Following the read operation $R_x$, the write operation $W^{\bar{x}}$ is executed to write the second pattern of bits in each successive row to allow the pattern to be detected during execution during the third sequence of read and write operations.

Following execution of the second sequence of read and write operations by the memory elements $12_1$-$12_n$, the SBRIC $20_1$ supplies a logic "high" level $SBC_1$ signal to the SBRIC $20_2$ which, in turn, causes the memory elements $12_{n+1}$-$12_p$, to each execute their second sequence of read and write operations by supplying the elements with the BFC signal. Once these memory elements have completed execution of their second stored sequence of read and write operations, then the SBRIC $20_2$ supplies a logic "high" level test complete signal $SBC_2$ to the next successive SBRIC $20_i$. The SBRIC $20_i$ then causes the memory elements in its associated bank $14_i$ to execute their second stored sequence of read and write operations ($R_x$ and $W^{\bar{x}}$) by supplying the elements with the BFC signal.

Each succeeding SBRIC is triggered in response to a logic "high"0 level SBC signal from the proceeding SBRIC 20. In response, the succeeding SBRIC signals the memory elements in its corresponding memory bank to execute their second stored set of read and write operations by supplying the memory elements with the BFC signal. This process continues until the memory elements $12_{p+2}$-$12_z$ in the last bank $14_k$ have executed their second stored sequence of read write operations. Thereafter, the SBRIC $20_k$ generates a logic "high" level test complete signal $SBC_k$ for receipt by either the SBRIC $20_{k+1}$ (or the LFSR 24 when no non-read/write elements $22_1$-$22_u$ are present). In response to the logic "high" level $SBC_k$ signal from the last SBRIC $20_k$, the SBRIC $20_{k+1}$ bypasses the signal to the next successive SBRIC $20_{k+2}$ which does likewise until the SBC signal is bypassed to the LFSR 24. The reason for bypassing the SBC signal is that each of the SBRICs $20_{k+1}$-$20_u$ only initiates self-testing of the non-read/write elements $22_1$-$22_u$ once.

In response to the logic "high" level test complete signal, the LFSR 24 commences counting in the same manner as that described previously. Once the LFSR 24 has counted to its predetermined count (corresponding to the predetermined interval), then the LFSR supplies a logic "high" level test begin command $SBC_0$ to the first SBRIC $20_1$. In response to the logic "high" level signal $SBC_0$ from the LFSR 24, the SBRIC $20_1$ signals the memory elements $12_i$-$12_n$ in the first bank to each execute their third read and write operation sequence stored in the field $18_3$ by supplying the memory elements with the BFC signal.

Like the second stored sequence of read and write instructions, the third stored instruction sequence is the same for each of the memory elements $12_1$-$12_z$. In practice, the third read and write instruction sequence executed by each memory element consists of a single read instruction $R_{\bar{x}}$. As may be appreciated, the read instruction $R_{\bar{x}}$ is executed to detect the presence of the second pattern of bits $\bar{X}$ in the memory element, which pattern was written therein during execution of the last write operation $W^{\bar{x}}$ performed during the second sequence of read and write operations. However, because the time required for the LFSR 24 to count to its predetermined count, the read operation $R_{\bar{x}}$ is not performed until a predetermined interval (e.g., 100 milliseconds) after the write operation $W^{\bar{x}}$, thus allowing any retention faults that may be present to manifest themselves.

The SBRICs $20_1$-$20_k$ signal the banks $14_i$-$14_k$ of memory elements $12_i$-$12_z$ in sequence so that the memory elements each execute their third stored sequence of read and write operations, and in particular, the read operation $R_{\bar{x}}$. Once the third stored sequence of read and write operations is executed by the memory elements in the last bank $14_k$, then the SBRIC $20_k$ generates a logic "high" test complete signal to signify that execution of the sequence of read and write operations by the memory elements $12_1$-$12_z$ in the banks $14_i$-$14_k$ is completed. As before, the $SBC_k$ signal from the SBRIC $20_k$ is bypassed by each of the SBRICs $20_{k+1}$-$20_u$ in succession because the non-read/write elements $22_1$-$22_u$ have already been tested.

Figure 2:
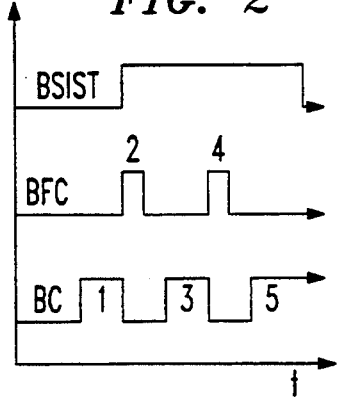
FIG. 2 is a graphical plot of various signals which are present in the apparatus of FIG. 1 during testing of the memory elements for retention faults.

To appreciate how each of the SBRICs $20_1$-$20_k$ signals the memory elements in a corresponding one of the banks $14_1$-$14_k$, to execute the first, second and third stored sequences of read and write instructions, reference should be had to FIG. 2 which graphically depicts the time relationship between the signals SBIST, BFC and BC for the SBRIC $20_i$. When the SBRIC $20_i$ is supplied initially with a logic "high" level begin command $SBC_{i-1}$, the SBRIC generates the SBIST signal which remains at a logic "high" level for the duration of testing. In response to the SBIST signal, each memory element in the associated bank $14_i$ executes its first sequence of read and write operations, at the completion of which the memory element generates a first BC signal, represented by the pulse 1 in FIG. 2. The BC signal remains at a logic high level until the corresponding SBRIC $20_i$ receives another $SBC_{i-1}$ to initiate self-testing of the memory elements in the associated bank $14_i$ again.

After the SBRIC $20_i$ receives a second test begin signal $SBC_{i-1}$, then the SBRIC generates a logic high level BFC signal of a short duration (pulse 2) to signal the memory elements in the bank $14_i$ to commence self-testing for a second time by executing their second sequence of read and write operations. Once the BFC signal goes high, the BC signal supplied by each of the memory elements in the bank $14_i$ now goes low while each memory element commences execution of its second stored sequence of operations. Once the memory elements have completed their second sequence of read and write operations, their BC signals go high (pulse 3) in a similar manner as described with respect to pulse 2.

In response to a third test begin signal, the SBRIC $20_i$ generates a second BFC signal (pulse 4), causing the memory elements in the bank $20_i$ to execute their third sequence of read and write operations. When this sequence of operations is completed, the BC signal of each memory element then goes high for a third time (pulse 5).

The foregoing describes a unified and autonomous retention fault detection technique.

It is to be understood that the above-described embodiments are merely illustrative of the principles of the invention. Various modifications and changes may be made thereto by those skilled in the art which will embody the principles of the invention and fall with. in the spirit and scope thereof.

I claim:

1. A method for fault testing each of a plurality of self-testing read and write memory elements arranged in banks, each memory element operative to execute first, second and third sequences of read and/or write operations, comprising the steps of: signaling each of the banks in succession for a first time to cause each memory element in a successive bank to execute its first sequence of read and write operations without any delay between operations, the first sequence containing a write operation which, when executed, causes a first pattern of bits to be present in that memory element at the completion of the first sequence of operations;

signaling the banks of memory elements in succession for a second time, after a first predetermined interval following signaling for the first time, to cause each memory element in a successive bank to execute its second sequence of read and write operations without any delay between operations, the second sequence including a read operation which is executed by each memory at the beginning of the second sequence to read itself to determine if the first pattern of bits is present, and a write operation, which upon execution, causes a second pattern of bits, complementary to the first pattern, to be present in the memory element at the completion of the second sequence of operations; and signaling the banks of memory elements in succession for a third time., after a second predetermined interval following signaling for the second time, to cause each memory element in a successive bank to execute the third sequence of operations without any delay between operations, the third sequence including a read operation which is executed by each memory element to determine if the second pattern of bits is present therein.

2. The method according to claim 1 wherein the step of signaling for a first time includes a step of supplying a Start, Built-In, Self-Test (SBIST) signal which is maintained in an active state during execution of the first, second and third sequences of operations by each memory element in each successive bank.

3. The method according to claim 1 wherein the step of signaling for a second time comprises supplying each memory element in each successive bank with a signal which becomes active after the memory element has signaled completion of execution of the first sequence of operations.

4. The method according to claim 1 wherein the step of signaling for a third time comprises supplying each memory element in each successive bank with a signal which becomes active alter the memory element has signaled completion of execution of the second sequence of operations.

5. A method for fault testing at least one self-testing non-read/write memory element and each of a plurality of self-testing read and write memory elements arranged in banks, each read and write memory element in each bank containing first, second and third sequences of read and/or write operations, comprising the steps of:

signaling each of the banks of read and write memory elements in succession for a first time to cause each memory read and write element in a successive bank to execute the first sequence of mad and write operations without any delay between operations, the first sequence containing a write operation, which, when executed, causes a first pattern of bits to be present in the read and write memory element at the completion of the first sequence of operations;

signaling the non-mad and write memory element to commence self-testing after the banks of mad and write memory elements have been successively signaled;

signaling the banks of mad and write memory elements in succession for a second time, after a first predetermined interval following signaling of the banks of read and write memory elements for the first time, to cause each read and write memory element in a successive bank to execute the second sequence to read and write operations without any delay between operations, the second sequence including a mad operation which is executed to read the read and write memory element to determine if the first pattern of bits is present, and a write operation, which upon execution, causes a second pattern of bits, complementary to the first pattern, to be present in the read and write memory element at the completion of the second sequence of operations; and signaling the banks of read and write memory elements in succession for a third time, after a second predetermined interval following signaling for the second time, to cause each read and write memory element in a successive bank to execute the third sequence of operations without any delay between operations, the third sequence including a read operation which is executed to determine if the second pattern of bits is present in the read and write memory element.

6. The method according to claim 5 wherein the step of signaling for a first time includes supplying a Start, Built-In, Self-Test (SBIST) signal which is maintained in an active state during execution of the first, second and third sequence of operations by each memory element in each successive bank.

7. The method according to claim 5 wherein the step of signaling for a second time comprises supplying each memory element in each successive bank with a signal which becomes active after the memory element has signaled completion of execution of the first sequence of operations.

8. The method according to claim 7 wherein the step of signaling for a third time comprises supplying each memory element in each successive bank with a signal which becomes active after the memory element has signaled completion of execution of the second sequence of operations.

9. Apparatus for fault testing each of a plurality of self-testing read and write memory elements arranged in banks which are coupled in daisy-chain fashion, each read and write memory element capable of executing first, second and third stored sequences of read and/or write operations, comprising:

control means coupled to the read and write memory elements in each of the banks for signaling the banks of read and write memory elements in succession at three separate intervals delayed in time to cause the read and write memory elements in each successive bank to execute a separate one of their first, second and third sequences of read and-/or write instructions so no delay occurs between operations in each sequence of operations; and delay means coupled to the control means and responsive to a test complete signal from a last one of the banks of memory elements for causing the control means to delay the signaling of the banks of read and write memory elements to execute their second and third sequences of read and/or write operations by a first and second predetermined interval, respectively.

10. The apparatus according to claim 9 wherein the control means comprises a plurality of Standard, Built-In, Self-Test, Resource Controllers (SBRICs) coupled in daisy-chain fashion, each SBRIC being associated with a separate bank of read and write memory elements for signaling the memory elements of the banks and for signaling a succeeding one of the SBPdCs in the chain to signal the read and write memory elements in its associated bank of read and write memory elements.

11. The apparatus according to claim 10 wherein the delay means comprises a Linear Feedback Shift Register (LFSR) responsive to a signal from a last SBRIC in the chain of SBRICs for delaying receipt of a signal therefrom for transmission to a first SBRIC in the chain.

* * * * *

UNITED STATES PATENT AND TRADEMARK OFFICE
CERTIFICATE OF CORRECTION

PATENT NO. : 5,381,419
DATED : January 10, 1995
INVENTOR(S) : Yervant Zorian

It is certified that error appears in the above-identified patent and that said Letters Patent is hereby corrected as shown below:

Column 5, line 67, "$W^{\bar{X}}$" should read --$W^X$--.

Column 7, line 11, "Self-testing" should read --self-testing--.

Column 7, line 64, ""high"0 level" should read --"high" level--.

Column 9, line 34, "with. in" should read --within--.

Column 9, line 41, "signaling" should begin a paragraph.

Column 10, line 32, "mad" should read --read--.

Column 10, line 39, "mad" should read --read--.

Column 10, line 40, "mad" should read --read--.

Column 10, line 43, "mad" should read --read--.

Column 10, line 51, "mad" should read --read--.

Column 12, line 20, "SBPdCs" should read --SBRICs--.

UNITED STATES PATENT AND TRADEMARK OFFICE
CERTIFICATE OF CORRECTION

PATENT NO. : 5,381,419

DATED : January 10, 1995

INVENTOR(S) : Yervant Zorian

It is certified that error appears in the above-identified patent and that said Letters Patent is hereby corrected as shown below:

"$12_l$" (occurs 12 times) should read --$12_1$--.

"$14_l$" (occurs 9 times) should read --$14_1$--.

"$20_l$" (occurs 10 times) should read --$20_1$--.

"$22_l$" (occurs 3 times) should read --$22_1$--.

Column 2, line 62, " < z," should read -- $\leq$ z,--.

Column 2, line 66, "(HFO)" should read --(FIFO)--.

Column 3, line 23, "dam" should read --data--.

Column 3, line 28, "mad/write" should read --read/write--.

Column 3, line 35, "patent application" should read --Patent Application--.

Column 3, line 41, "$20_l - 2_k$" should read --$20_1 - 20_k$--.

Column 4, line 37, " > 1" should read -- $\geq$ 1--.

Column 4, line 53, " t $\geq$ k+1" should read -- t $\geq$ k+1--.

UNITED STATES PATENT AND TRADEMARK OFFICE
CERTIFICATE OF CORRECTION

PATENT NO. : 5,381,419
DATED : January 10, 1995
INVENTOR(S) : Yervant Zorian

It is certified that error appears in the above-indentified patent and that said Letters Patent is hereby corrected as shown below:

Column 5, line 3, "interleave" should read --interleaved--.

Signed and Sealed this

Second Day of May, 1995

BRUCE LEHMAN

*Attest:*

*Attesting Officer*   Commissioner of Patents and Trademarks